(12) United States Patent
Fukuhara et al.

(10) Patent No.: US 11,082,642 B2
(45) Date of Patent: Aug. 3, 2021

(54) PHOTOELECTRIC CONVERSION DEVICE, IMAGING SYSTEM, AND MOBILE APPARATUS

(71) Applicant: CANON KABUSHIKI KAISHA, Tokyo (JP)

(72) Inventors: Takashi Fukuhara, Higashikurume (JP); Takanori Yamashita, Hachioji (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 2 days.

(21) Appl. No.: 16/794,479

(22) Filed: Feb. 19, 2020

(65) Prior Publication Data

US 2020/0275037 A1 Aug. 27, 2020

(30) Foreign Application Priority Data

Feb. 26, 2019 (JP) .............................. JP2019-032896

(51) Int. Cl.
*H04N 5/341* (2011.01)
*G08G 1/16* (2006.01)
*H04N 5/357* (2011.01)
*H03M 1/56* (2006.01)

(52) U.S. Cl.
CPC .............. *H04N 5/341* (2013.01); *G08G 1/16* (2013.01); *H03M 1/56* (2013.01); *H04N 5/357* (2013.01)

(58) Field of Classification Search
CPC ..................................................... H04N 5/341

USPC ......................................................... 348/302
See application file for complete search history.

(56) References Cited

U.S. PATENT DOCUMENTS

| | | | |
|---|---|---|---|
| 7,903,056 B2 | 3/2011 | Kawasaki | |
| 9,502,451 B2 | 11/2016 | Yamashita | |
| 9,525,836 B2 * | 12/2016 | Hashimoto | ............ H04N 5/378 |
| 9,653,498 B2 | 5/2017 | Yamashita | |
| 9,749,570 B2 | 8/2017 | Yamashita | |
| 10,051,223 B2 | 8/2018 | Yamashita | |
| 10,057,529 B2 | 8/2018 | Saito | |
| 2010/0103017 A1 | 4/2010 | Satoshi | |
| 2018/0309950 A1 | 10/2018 | Yamashita | |

(Continued)

FOREIGN PATENT DOCUMENTS

| | | |
|---|---|---|
| JP | 2010-103913 | 5/2010 |
| JP | 2010-154562 | 7/2010 |

(Continued)

*Primary Examiner* — Joel W Fosselman
(74) *Attorney, Agent, or Firm* — Venable LLP

(57) ABSTRACT

Provided is a photoelectric conversion device including: a pixel configured to generate a first signal in accordance with an incident light by photoelectric conversion; an amplifier unit configured to amplify the first signal to output a second signal; and a comparator unit configured to compare a voltage of the second signal with a voltage of a reference signal. A slope of the ramp waveform included in the reference signal can be switched between a first slope $\alpha$ and a second slope $\beta$, the reference voltage used for determining a setting of a gain in the amplifier unit or the comparator unit can be switched between a first reference voltage Vref1 corresponding to the first slope $\alpha$ and a second reference voltage Vref2 corresponding to the second slope $\beta$, and $\alpha/\beta \neq \text{Vref1/Vref2}$ is satisfied.

11 Claims, 13 Drawing Sheets

(56) References Cited

U.S. PATENT DOCUMENTS

2019/0349540 A1   11/2019   Yamashita
2019/0379850 A1   12/2019   Shinohara

FOREIGN PATENT DOCUMENTS

JP    2015-162751    9/2015
JP    2017-85661     5/2017

* cited by examiner

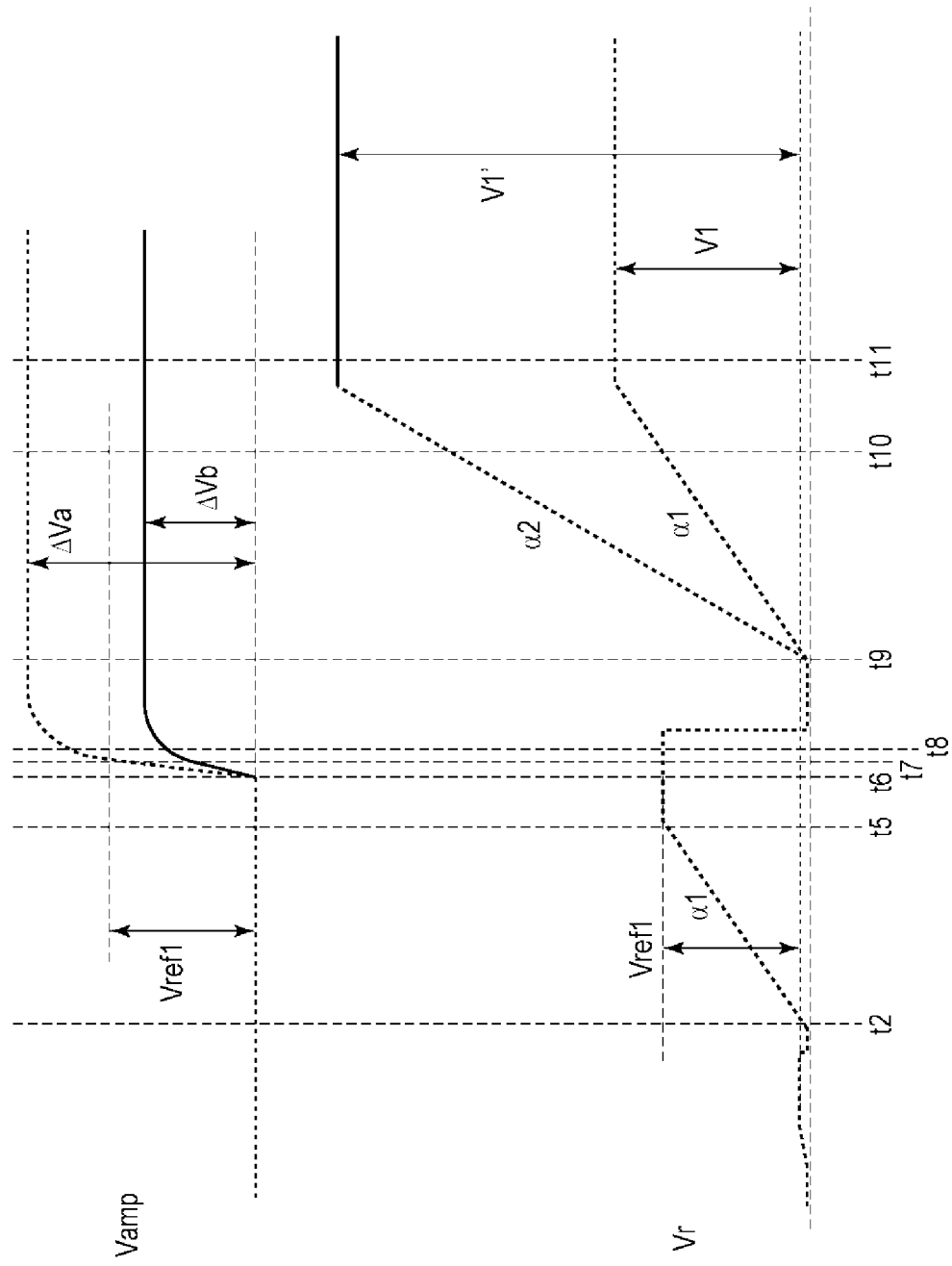

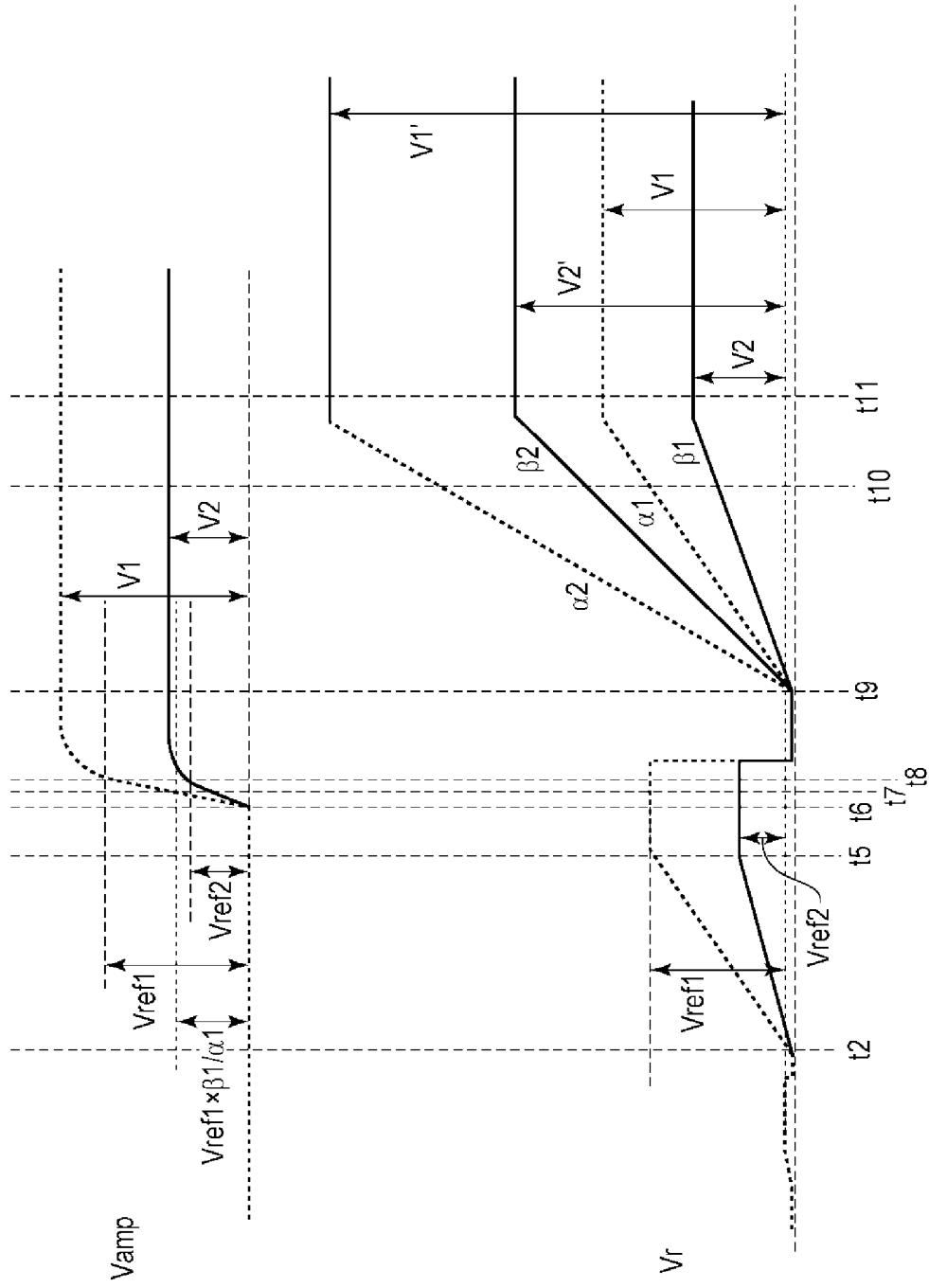

PHOTOELECTRIC CONVERSION DEVICE, IMAGING SYSTEM, AND MOBILE APPARATUS

BACKGROUND OF THE INVENTION

Field of the Invention

The present invention relates to a photoelectric conversion device, an imaging system, and a mobile apparatus.

Description of the Related Art

In imaging devices mounted on digital cameras or the like, some imaging devices convert an analog signal obtained by photoelectric conversion into a digital signal and output the digital signal. Japanese Patent Application Laid-Open No. 2015-162751 discloses a photoelectric conversion device having an analog-to-digital (AD) converter that employs a scheme to compare an analog signal with a ramp signal and perform analog-to-digital conversion (AD conversion). The photoelectric conversion device disclosed in Japanese Patent Application Laid-Open No. 2015-162751 uses a scheme to select a ramp signal used for AD conversion out of a plurality of ramp signals having different slops based on a result of comparison between an analog signal voltage and a threshold.

In a photoelectric conversion device that performs comparison between an analog signal voltage and a reference voltage prior to AD conversion as disclosed in Japanese Patent Application Laid-Open No. 2015-162751, the time when comparison between an analog signal voltage and a reference voltage is performed may occur before the analog signal voltage is settled. In such a case, the accuracy of an output signal may decrease.

SUMMARY OF THE INVENTION

Accordingly, the present invention intends to provide a photoelectric conversion device, an imaging system, and a mobile apparatus in which the accuracy of an output signal is improved when configured to compare an analog signal voltage with a reference threshold prior to AD conversion.

According to an aspect of the present invention, provided is a photoelectric conversion device including: a pixel configured to generate a first signal in accordance with an incident light by photoelectric conversion; an amplifier unit configured to amplify the first signal to output a second signal; and a comparator unit configured to compare a voltage of the second signal with a voltage of a reference signal. In a first period that is a period before the voltage of the second signal is settled, the voltage of the reference signal is a reference voltage. In the first period, the comparator unit compares the voltage of the second signal with the reference voltage to generate a determination result signal used for setting a gain. In a second period that is a period after the voltage of the second signal is settled, the reference signal has a ramp waveform whose voltage changes in accordance with time. In the second period, the comparator unit compares the voltage of the second signal with a voltage of the ramp waveform to perform analog-to-digital conversion. A slope of the ramp waveform is configured to be switched between a first slope $\alpha$ and a second slope $\beta$. The reference voltage is configured to be switched between a first reference voltage Vref1 corresponding to the first slope $\alpha$ and a second reference voltage Vref2 corresponding to the second slope $\beta$. The first slope $\alpha$, the second slope $\beta$, the first reference voltage Vref1, and the second reference voltage Vref2 satisfy $\alpha/\beta \neq \text{Vref1}/\text{Vref2}$.

Further features of the present invention will become apparent from the following description of exemplary embodiments with reference to the attached drawings.

BRIEF DESCRIPTION OF THE DRAWINGS

FIG. 9 is a timing diagram illustrating an operation of an imaging device according to a second embodiment.

FIG. 10 is a diagram illustrating a setting of a reference voltage according to the second embodiment.

DESCRIPTION OF THE EMBODIMENTS

Preferred embodiments of the present invention will now be described in detail in accordance with the accompanying drawings. Note that, although an imaging device used for capturing an image of a subject will be illustrated as an example in the following embodiments, the present invention is generally applicable to photoelectric conversion devices. In other words, the imaging device according to each of the embodiments is one example of the photoelectric conversion devices.

First Embodiment

Figure 1:
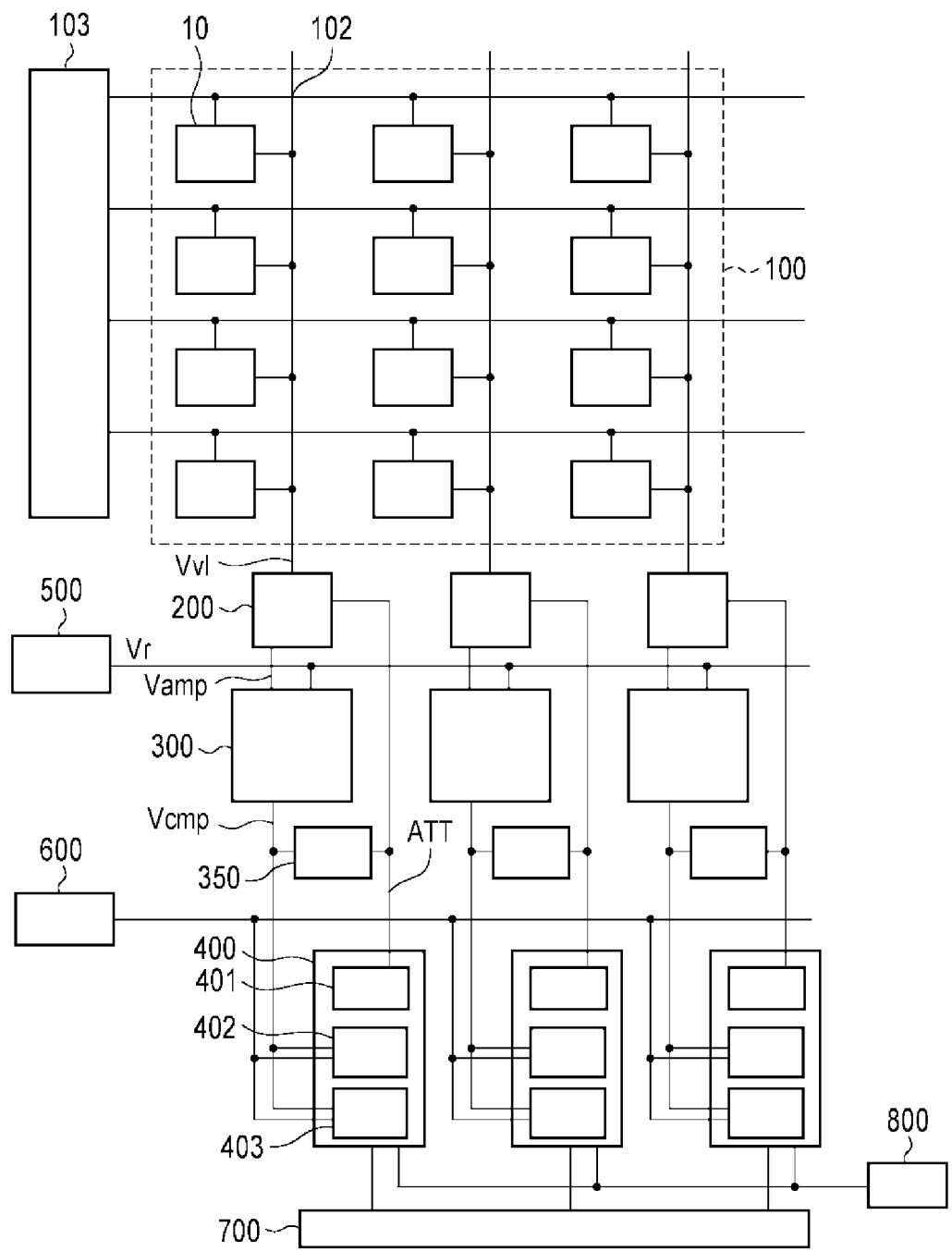
FIG. 1 is a diagram illustrating a configuration example of an imaging device according to a first embodiment.

FIG. 1 is a diagram illustrating a configuration example of an imaging device according to the present embodiment. The imaging device of the present embodiment is formed on one or a plurality of semiconductor substrates, for example. The imaging device has a pixel array 100, a vertical scanning circuit 103, column amplifier units 200, column comparator units 300, determination circuits 350, column memory units 400, a reference signal generation unit 500, a count signal generation unit 600, a horizontal scanning circuit 700, and a signal processing circuit 800.

The pixel array 100 has a plurality of pixels 10 arranged to form a plurality of rows and a plurality of columns. The column amplifier units 200, the column comparator units 300, the determination circuits 350, and the column memory units 400 are arranged in association with respective columns of the pixel array 100. The vertical scanning circuit 103 outputs, to the plurality of pixels 10, control signals used for performing a photoelectric conversion operation, a charge transfer operation, or the like on a row basis. Logic circuits such as a shift register, an address decoder, or the like may be used for the vertical scanning circuit 103. The plurality of pixels 10 output pixel output signals Vv1 (first signal) via common pixel output lines 102 on a column basis. The pixel output signals Vv1 are input to the column amplifier units 200. Note that the configuration of the pixel array 100 is not limited to the arrangement forming a plurality of rows and a plurality of columns, and at least one of the number of rows and the number of columns may be singular.

The column amplifier unit 200 amplifies the pixel output signal Vv1 at a predetermined gain to output an amplifier unit output signal Vamp (second signal). The amplifier unit output signal Vamp is input to the column comparator unit 300. The reference signal generation unit 500 generates a reference signal Vr and supplies the reference signal Vr to the column comparator unit 300 on each column. The column comparator unit 300 compares the levels between the amplifier unit output signal Vamp and the reference signal Vr and outputs a comparison result signal Vcmp indicating a comparison result. The comparison result signal Vcmp is input to the determination circuit 350 and the column memory unit 400. The determination circuit 350 determines the level of the amplifier unit output signal Vamp based on the comparison result signal Vcmp and outputs a determination result signal ATT indicating a determination result to the column memory unit 400. Note that the column amplifier unit 200, the column comparator unit 300, and the column memory unit 400 may be simply referred to as an amplifier unit, a comparator unit, and a memory unit, respectively.

The column memory unit 400 has a J-memory 401, an N-memory 402, and an S-memory 403. The J-memory 401 stores the determination result signal ATT input from the determination circuit 350. The determination result signal ATT is fed back to the column amplifier unit 200. The gain of the column amplifier unit 200 changes in accordance with the level of the determination result signal ATT.

The count signal generation unit 600 generates a count signal whose value (count value) changes in accordance with time and supplies the count signal to the column memory on each column. The count signal is supplied to the N-memory 402 and the S-memory 403. A count value being input at the time when the level of the comparison result signal Vcmp changes is stored in the N-memory 402 and the S-memory 403. Thereby, a signal obtained by performing analog-to-digital conversion (AD conversion) on the amplifier unit output signal Vamp is stored in the N-memory 402 and the S-memory 403.

The horizontal scanning circuit 700 is formed of logic circuits such as a shift register, an address decoder, or the like. The horizontal scanning circuit 700 outputs values stored in the column memory units 400 on respective columns to the signal processing circuit 800 sequentially on a column basis. The signal processing circuit 800 performs digital signal processing such as digital gain processing, digital correlated double sampling, digital offset, linearity correction, or the like. The signal processing circuit 800 outputs a digital signal obtained after signal processing. Such a scheme of output signals may be a single-end scheme to perform voltage output from a single terminal or a Low Voltage Differential Signaling (LVDS) scheme having differential two terminals, for example.

Figure 2:
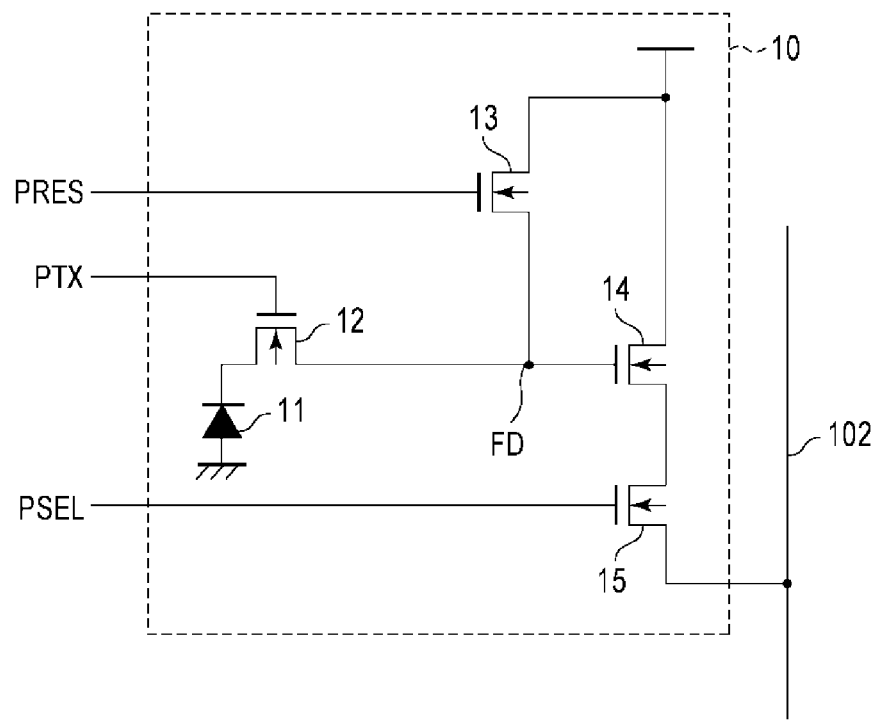
FIG. 2 is a diagram illustrating a configuration example of a pixel according to the first embodiment.

Components forming the imaging device of FIG. 1 will be described in more detail with reference to FIG. 2 to FIG. 5. FIG. 2 is a diagram illustrating a configuration example of the pixel 10. The pixel 10 has a photoelectric conversion unit 11, a transfer transistor 12, a reset transistor 13, an amplification transistor 14, and a select transistor 15. These transistors are MOS transistors, for example.

The photoelectric conversion unit 11 photoelectrically converts an incident light and accumulates charges generated by photoelectric conversion. For example, a photodiode may be used as the photoelectric conversion unit 11. In the following description, the photoelectric conversion unit 11 is a photodiode having an anode and a cathode. The anode of the photoelectric conversion unit 11 is connected to a ground potential line, and the cathode is connected to the source of the transfer transistor 12.

The drain of the transfer transistor 12 is connected to the source of the reset transistor 13 and the gate of the amplification transistor 14. The connection node of the drain of the transfer transistor 12, the source of the reset transistor 13, and the gate of the amplification transistor 14 is a floating diffusion region FD. The drain of the reset transistor 13 is connected to a power source potential line. The source of the amplification transistor 14 is connected to the drain of the select transistor 15. The drain of the amplification transistor 14 is connected to the power source potential line. The source of the select transistor 15 is connected to the pixel output line 102. The pixel output line 102 is connected to a current source (not illustrated).

On each row of the pixel array 100, a plurality of control signal lines are arranged extending in a row direction (the horizontal direction in FIG. 1 and FIG. 2). The vertical scanning circuit 103 supplies control signals to the transistors in the pixel 10 via the plurality of control signal lines. The vertical scanning circuit 103 supplies control signals PTX, PRES, and PSEL to the gates of the transfer transistor 12, the reset transistor 13, and the select transistor 15, respectively.

When controlled to be turned on by the control signal PTX, the transfer transistor 12 transfers charges generated by the photoelectric conversion unit 11 to the floating diffusion region FD. When controlled to be turned on by the control signal PRES, the reset transistor 13 resets the potential of the floating diffusion region FD. When controlled to be turned on by the control signal PSEL, the select transistor 15 outputs a signal from the amplification transistor 14 on the row of interest to the pixel output line 102. At this time, the amplification transistor 14 and the current source connected to the pixel output line 102 form a source follower circuit that outputs a signal in accordance with charges transferred to the floating diffusion region FD and thereby function as an output unit.

Figure 3:
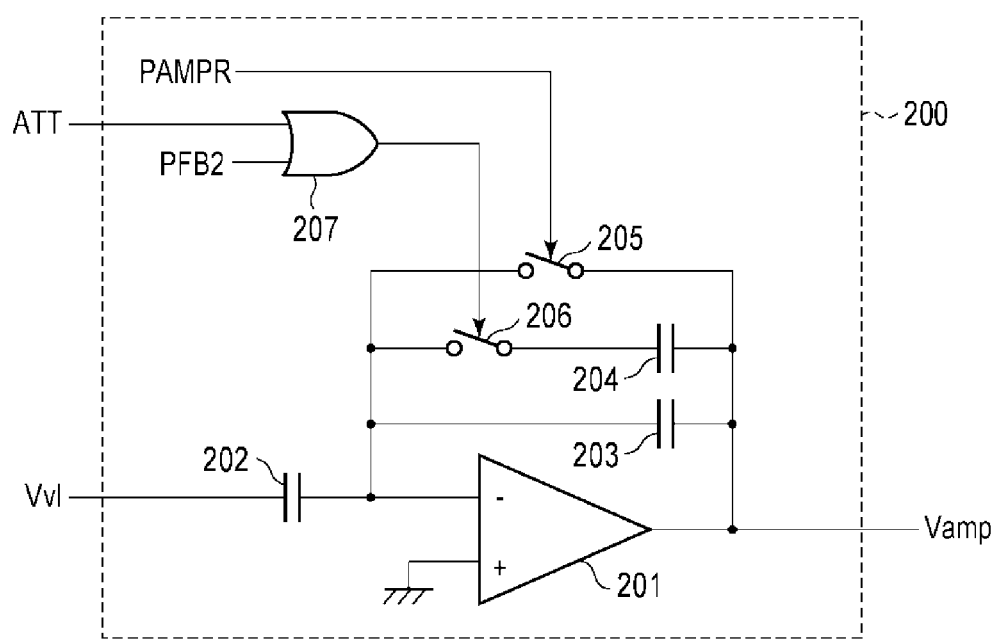
FIG. 3 is a diagram illustrating a configuration example of a column amplifier unit according to the first embodiment.

FIG. 3 is a diagram illustrating a configuration example of the column amplifier unit 200. The column amplifier unit 200 has an operational amplifier 201, an input capacitor 202, feedback capacitors 203 and 204, switches 205 and 206, and an OR circuit 207. One end of the input capacitor 202 forms the input terminal of the column amplifier unit 200 to which the pixel output signal Vv1 is input. The other end of the input capacitor 202 is connected to the inverting input terminal of the operational amplifier 201. A predetermined potential such as the ground potential is provided to the non-inverting input terminal of the operational amplifier 201. One end of the feedback capacitor 203 is connected to the inverting input terminal of the operational amplifier 201, and the other end of the feedback capacitor 203 is connected to the output terminal of the operational amplifier 201. The amplifier unit output signal Vamp is output from the output terminal of the operational amplifier 201. That is, the output terminal of the operational amplifier 201 forms the output terminal of the column amplifier unit 200.

One end of the switch 206 is connected to the inverting input terminal of the operational amplifier 201, and the other end of the switch 206 is connected to one end of the feedback capacitor 204. The other end of the feedback capacitor 204 is connected to the output terminal of the operational amplifier 201. One end of the switch 205 is connected to the inverting input terminal of the operational amplifier 201, and the other end of the switch 205 is connected to the output terminal of the operational amplifier 201. The switch 205 is controlled by a control signal PAMPR supplied from a timing generator (not illustrated). The determination result signal ATT stored in the J-memory 401 and a control signal PFB2 supplied from the timing generator (not illustrated) are input to the two input terminals of the OR circuit 207, respectively. The OR circuit 207 supplies a logical sum of these input signals to the switch 206. The switch 206 is controlled by a signal supplied from the OR circuit 207.

For example, the capacitance value of the feedback capacitor 204 and the capacitance value of the input capacitor 202 are set to 3C and 4C, respectively, where the capacitance value of the feedback capacitor 203 is C. In such a case, the gain of the column amplifier unit 200 is one-fold when the switch 206 is in an on-state, and the gain of the column amplifier unit 200 is four-fold when the switch 206 is in an off-state. That is, the switch 206 has a function of switching the gain of the column amplifier unit 200. When the switch 205 is turned on, the inverting input terminal and the output terminal of the operational amplifier 201 are short-circuited, and charges held in respective capacitors are reset. That is, the switch 205 has a function of resetting the column amplifier unit 200. Note that the values of the gains described above are absolute values. In this circuit configuration, since the column amplifier unit 200 is an inverting amplifier circuit, the signs of the voltages are inverted between the input and the output in the actual implementation.

Figure 4:
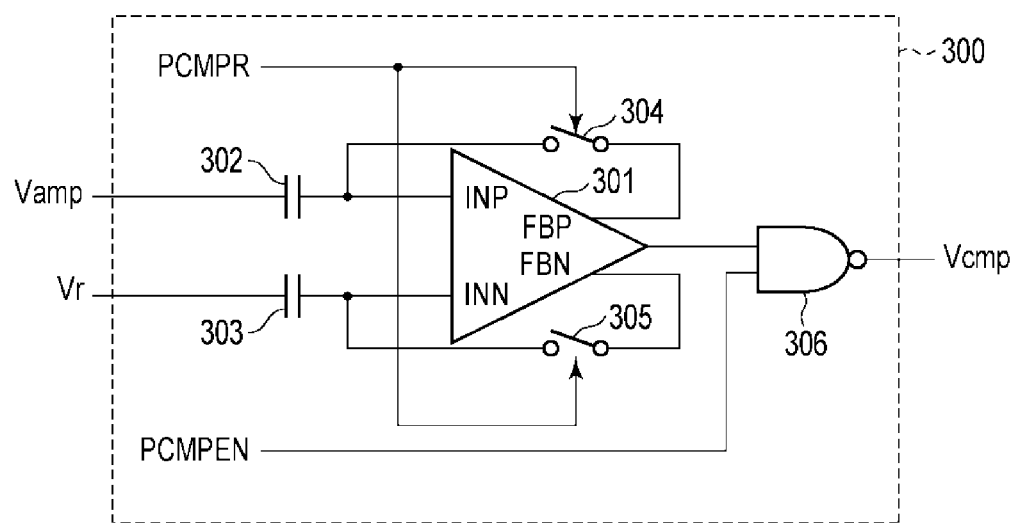
FIG. 4 is a diagram illustrating a configuration example of a column comparator unit according to the first embodiment.

FIG. 4 is a diagram illustrating a configuration example of the column comparator unit 300. The column comparator unit 300 has a differential amplifier 301, input capacitors 302 and 303, switches 304 and 305, and a NAND circuit 306. One end of the input capacitor 302 forms a first input terminal of the column comparator unit 300 to which the amplifier unit output signal Vamp is input. The other end of the input capacitor 302 is connected to an input terminal INP of the differential amplifier 301. One end of the input capacitor 303 forms a second input terminal of the column comparator unit 300 to which the reference signal Vr is input. The other end of the input capacitor 303 is connected to an input terminal INN of the differential amplifier 301.

One end of the switch 304 is connected to the input terminal INP of the differential amplifier 301, and the other end of the switch 304 is connected to a feedback terminal FBP of the differential amplifier 301. One end of the switch 305 is connected to the input terminal INN of the differential amplifier 301, and the other end of the switch 305 is connected to a feedback terminal FBN of the differential amplifier 301. The switches 304 and 305 are controlled by a control signal PCMPR supplied from a timing generator (not illustrated). Note that the switches 304 and 305 may be formed of MOS transistors, for example.

An output signal of the differential amplifier 301 and a control signal PCMPEN supplied from the timing generator (not illustrated) are input to the two input terminals of the NAND circuit 306, respectively. The comparison result signal Vcmp is output from the output terminal of the NAND circuit 306. That is, the output terminal of the NAND circuit 306 forms the output terminal of the column comparator unit 300.

Figure 5:
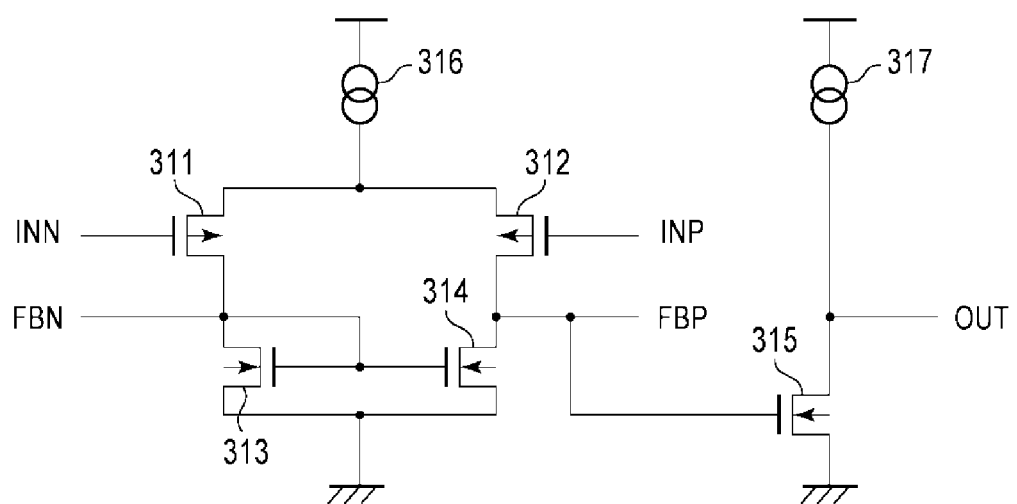
FIG. 5 is a diagram illustrating a configuration example of an operational amplifier according to the first embodiment.

FIG. 5 is a diagram illustrating a configuration example of the differential amplifier 301. The differential amplifier 301 has transistors 311, 312, 313, 314, and 315 and current sources 316 and 317. The transistors 311 and 312 are P-channel type MOS transistors, and the transistors 313, 314, and 315 are N-channel type MOS transistors.

The gate of the transistor 311 forms the input terminal INN of the differential amplifier 301, and the gate of the transistor 312 forms the input terminal INP of the differential amplifier 301. The sources of the transistors 311 and 312 are connected to the current source 316. The drain of the transistor 311 is connected to the drain of the transistor 313, the gate of the transistor 313, and the gate of the transistor 314. The drain of the transistor 312 is connected to the drain of the transistor 314 and the gate of the transistor 315. The sources of the transistors 313 and 314 are connected to the ground potential line. The connection node of the drain of the transistor 311, the drain of the transistor 313, the gate of the transistor 313, and the gate of the transistor 314 forms the feedback terminal FBN. The connection node of the drain of the transistor 312, the drain of the transistor 314, and the gate of the transistor 315 forms the feedback terminal FBP. The transistors 311, 312, 313, and 314 and the current source 316 function as the differential input stage of the differential amplifier 301.

The source of the transistor 315 is connected to the ground potential line, and the drain of the transistor 315 is connected to the current source 317. The connection node of the drain of the transistor 315 and the current source 317 forms the output terminal of the differential amplifier 301. The transistor 315 and the current source 317 form a source grounded circuit and function as the output stage of the differential amplifier 301.

Figure 6:
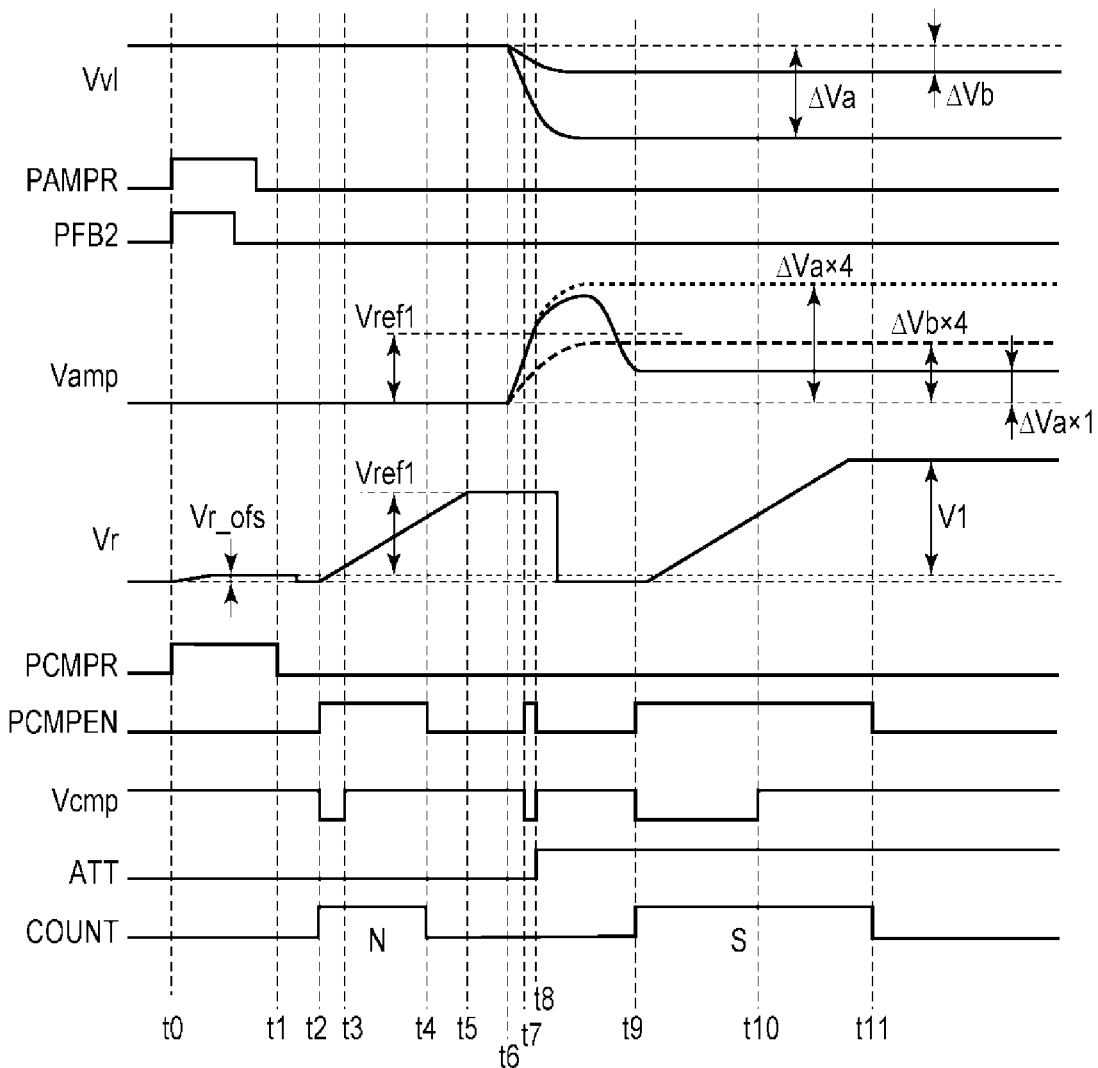
FIG. 6 is a timing diagram illustrating an operation of the imaging device according to the first embodiment.

The operation of the imaging device of the present embodiment will be described with reference to FIG. 6. FIG. 6 is a timing diagram illustrating the operation of the imaging device according to the present embodiment. Note that each of the transistors and switches to which control signals illustrated in FIG. 6 are input is in an on-state when each control signal is at a high level and in an off-state when each control signal is at a low level.

The period from time t0 to time t1 is a period in which each unit of the imaging device is reset. In this period, the pixel 10 outputs, to the pixel output line 102, the pixel output signal Vv1 corresponding to a reset state of the floating diffusion region FD. The pixel output signal Vv1 at this time may be referred to as a pixel reference signal. This operation is performed when the control signal PRES (not illustrated in FIG. 6) transitions to the high level and the reset transistor 13 is turned on.

In the same period, the control signals PAMPR and PFB2 are controlled to the high level, and the switches 205 and 206 are turned on. Accordingly, the inverting input terminal and the output terminal of the operational amplifier 201 are short-circuited and thereby the feedback capacitors 203 and 204 are reset, and the pixel reference signal is clamped at the input capacitor 202. At time t1 after the reset, the control signals PAMPR and PFB2 already retuned to the low level, and the switches 205 and 206 are in the off-state. Thus, the column amplifier unit 200 operates as an inverting amplifier circuit whose gain is four-fold.

Furthermore, in the same period, the control signal PCMPR is controlled to the high level, and the switches 304 and 305 are turned on. Thereby, the input terminal INP and the feedback terminal FBP of the differential amplifier 301 are short-circuited, and the input terminal INN and the feedback terminal FBN are short-circuited. With this operation, a voltage by which the difference between the amplifier unit output signal Vamp and the reference signal Vr at the time t1 by the control signal PCMPR becomes zero is held in the input capacitors 302 and 303 (auto-zero operation). To perform this auto-zero operation, an offset potential Vr_ofs is added in advance to the potential of the reference signal Vr. Further, in the same period, the control signal PCMPEN is maintained at the low level. Thus, the output of the NAND circuit 306 is fixed to the high level, and the comparison result signal Vcmp is at the high level regardless of the input of the differential amplifier 301. That is, the control signal PCMPEN is a signal used for controlling enabling or disabling of comparison at the column comparator unit 300.

The period from time t2 to time t4 is an N_AD conversion period (first period) in which AD conversion of a signal based on the reset state of the pixel 10 is performed. In this period, the count signal generation unit 600 supplies a count signal to the N-memory 402. Note that "COUNT" in FIG. 6 indicates whether or not a count signal is supplied by the count signal generation unit 600, and when "COUNT" is at the high level, a count signal is supplied. Further, "N" in "COUNT" of FIG. 6 indicates a count used for N_AD conversion, and "S" indicates a count used for S_AD conversion described later. Further, the reference signal Vr output from the reference signal generation unit 500 has a ramp waveform whose potential changes in a direction of increase at a slope α in accordance with time. Further, the control signal PCMPEN is at the high level in the same period, and the level of the comparison result signal Vcmp that is the output of the NAND circuit 306 is the same as the level of the output of the differential amplifier 301. That is, comparison at the column comparator unit 300 is enabled, and the level of the comparison result signal Vcmp indicates the level relationship between the amplifier unit output signal Vamp and the reference signal Vr.

At time t3, the level relationship between the amplifier unit output signal Vamp and the reference signal Vr changes due to the increase of the potential of the reference signal Vr. Thereby, the comparison result signal Vcmp changes from the low level to the high level. The N-memory 402 stores, as an N_AD conversion result, a counter value being input at the moment when the level of the comparison result signal Vcmp changes. The supply of the count signal by the count signal generation unit 600 stops at time t4, the control signal PCMPEN is controlled to the low level, and thereby the N_AD conversion period ends. The counter value stored in the N-memory 402 is used for signal correction by correlated double sampling.

In the period from time t4 to time t5, the potential of the reference signal Vr increases at the slope α subsequent to the N_AD conversion period. The increase in the potential of the reference signal Vr stops at time t5, and the reference signal Vr is fixed to a reference voltage Vref1. In such a way, the reference voltage Vref1 is generated by extrapolating the ramp waveform of the reference signal Vr up to time t5.

In the period from time t6 to time t8, operations for output of an optical signal from the pixel 10 and gain setting of the column amplifier unit 200 are performed. At time t6, the control signal PTX (not illustrated in FIG. 6) is controlled to the high level, and the transfer transistor 12 is turned on. Thereby, charges accumulated in the photoelectric conversion unit 11 are transferred to the floating diffusion region FD, and the pixel output signal Vv1 corresponding to these charges is output to the pixel output to the pixel output line 102. Thereby, the potential of the pixel output signal Vv1 decreases in accordance with the accumulated charges, and the potential of the amplifier unit output signal Vamp increases in accordance with the accumulated charges. FIG. 6 illustrates the changes in the potentials of the pixel output signal Vv1 and the amplifier unit output signal Vamp on the same graph for two cases: a case of a large amount of accumulated charges ($\Delta$Va in FIG. 6) and a case of a small amount of accumulated charges ($\Delta$Vb in FIG. 6). The signal amplitude of the pixel output signal Vv1 is $\Delta$Va or $\Delta$Vb. Since the column amplifier unit 200 is an amplifier circuit having a gain of four-fold, the signal amplitude of the amplifier unit output signal Vamp is ($\Delta$Va×4) or ($\Delta$Vb×4).

In the determination period from time t7 to time t8, the control signal PCMPEN is controlled to the high level, and comparison at the column comparator unit 300 is enabled. The level of the comparison result signal Vcmp transitions to the low level based on the level relationship between the amplifier unit output signal Vamp and the reference signal Vr (the reference voltage Vref1 in the determination period). In the present embodiment, comparison between the amplifier unit output signal Vamp and the reference voltage Vref1 is performed before the amplifier unit output signal Vamp is settled, and thereby the time for waiting for settling is omitted, which enables a faster operation.

Herein, the setting of the reference voltage Vref1 will be described. It is assumed that the maximum voltage at the time of settling of the amplifier unit output signal Vamp is equal to an amplitude value V1 of the reference signal Vr (the range of the voltage of the ramp waveform) supplied in the S_AD conversion period from time t9 to time t11 described later. At this time, the reference voltage Vref1 is set to be the same as the voltage of the amplifier unit output signal Vamp in the determination period that is a period before the amplifier unit output signal Vamp is settled to V1. With such a setting, the dynamic range of the ramp waveform of the reference signal Vr (amplitude value V1) in the S_AD conversion period from time t9 to time t11 can be effectively used.

Next, switching of a gain in the column amplifier unit 200 will be described. As described above, it is assumed that the signal amplitude of the pixel output signal Vv1 is $\Delta$Va or $\Delta$Vb, and the relationship of $\Delta$Va×4>Vref1>$\Delta$Vb×4 is satisfied. The setting of a gain of the column amplifier unit 200 is defined based on a comparison result between the amplifier unit output signal Vamp and the reference voltage Vref1. When the signal amplitude of the pixel output signal Vv1 is $\Delta$Va, since Vamp>Vref1 is established, the level of the comparison result signal Vcmp is the low level. In contrast, when the signal amplitude of the pixel output signal Vv1 is $\Delta$Vb, since Vamp<Vref1 is established, the level of the comparison result signal Vcmp is the high level.

At time t8, the determination circuit 350 outputs the determination result signal ATT of the level in accordance with the level of the comparison result signal Vcmp. Specifically, when the comparison result signal Vcmp is at the low level, the determination circuit 350 outputs a high-level determination result signal ATT and when the comparison result signal Vcmp is at the high level, the determination circuit 350 outputs a low-level determination result signal ATT. FIG. 6 illustrates the temporal change of the determination result signal ATT when the comparison result signal Vcmp is at the low level in the determination period (that is, when the signal amplitude of the pixel output signal Vv1 is ΔVa). The determination result signal ATT is stored in the J-memory 401 and fed back to the column amplifier unit 200. In response to transition of the determination result signal ATT to the high level, the switch 206 is turned on, and the gain of the column amplifier unit 200 is reduced from four-fold to one-fold. When the determination result signal ATT is maintained at the low level, the switch 206 remains in the off-state, and the gain is maintained at four-fold. In such a way, the gain of the column amplifier unit 200 is dynamically controlled in accordance with the output amplitude of the column amplifier unit 200.

At time t9, the pixel output signal Vv1 is settled. When the signal amplitude of the pixel output signal Vv1 is ΔVa, since the gain of the column amplifier unit 200 is one-fold, the amplifier unit output signal Vamp is ΔVa×1 at time t9. In contrast, when the signal amplitude of the pixel output signal Vv1 is ΔVb, since the gain of the column amplifier unit 200 is four-fold, the amplifier unit output signal Vamp is ΔVb×4 at time t9.

The period from time t9 to time t11 is the S_AD conversion period (second period) in which AD conversion of a signal output from the pixel 10 based on an incident light to the photoelectric conversion unit 11 is performed. In this period, the count signal generation unit 600 supplies a count signal to the S-memory 403. The reference signal Vr output from the reference signal generation unit 500 has a ramp waveform whose potential changes in a direction of increase at a slope α in accordance with time. By changing the value of the slope α, it is possible to adjust the gain caused by the S_AD conversion. Also in the S_AD conversion period, when the same process as in the N_AD conversion period is performed, the S-memory 403 stores, as an S_AD conversion result, a counter value being input at the moment when the level of the comparison result signal Vcmp changes.

After time t11, data stored in the J-memory 401, the N-memory 402, and the S-memory 403 on each column are sequentially transferred to the signal processing circuit 800 in accordance with a scan performed by the horizontal scanning circuit 700. The signal processing circuit 800 performs digital gain processing for digitally amplifying a digital signal transferred from the S-memory 403 on the same column based on data transferred from the J-memory 401.

An example of digital gain processing will be described. The signal processing circuit 800 performs digital gain processing on data transferred from the S-memory 403 at a gain of one-fold when the determination result signal ATT is at the low level and at a gain of four-fold when the determination result signal ATT is at the high level. Such digital gain processing may be made by performing bit shift on digital data. Thereby, it is possible to maintain continuity between a light amount of an incident light and a final output signal. This digital gain processing may change resolution of the output signal. In a range in which the determination result signal ATT is at the low level (when the signal amplitude of the pixel output signal Vv1 is small), the value of the output signal changes on a one-least significant bit (LSB) basis. In contrast, in a range in which the determination result signal ATT is at the high level (when the signal amplitude of the pixel output signal Vv1 is large), the value of the output signal changes on a four-LSB basis. In such a way, the resolution of the processed digital signal is higher in the range of a smaller pixel output signal Vv1 and is lower in the range of a larger pixel output signal Vv1.

Figure 7:
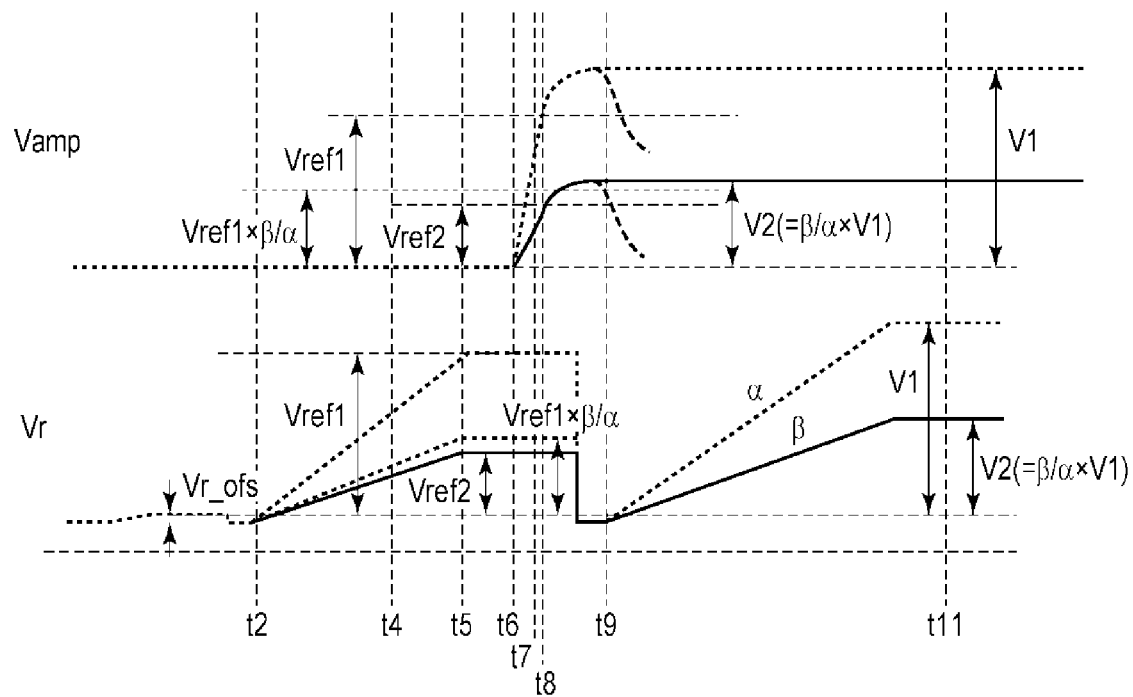
FIG. 7 is a diagram illustrating a setting of a reference voltage according to the first embodiment.

A method of setting a reference voltage in the present embodiment will be described with reference to FIG. 7. FIG. 7 is a timing diagram illustrating a setting of the reference voltage according to the present embodiment. In the present embodiment, it is assumed that the total gain of the imaging device is determined by the gain of the column amplifier unit 200, the slope of the ramp waveform of the reference signal Vr output from the reference signal generation unit 500 during the S_AD conversion period, and the digital gain in the signal processing circuit 800. One conceivable scheme for changing the total gain may be to change the slope of the ramp waveform of the reference signal Vr in the S_AD conversion period from time t9 to time t11. FIG. 7 illustrates an example when the slope of the ramp waveform is changed between two slopes of α and β. Since the slope β is smaller than the slope α, the total gain can be increased by changing the slope α to the slope β. An amplitude value V2 of the reference signal Vr when the slope is β is β/α times the amplitude value V1. That is, the relationship of V1/V2=α/β is established.

Further, it is assumed that the amplitude at the time of settling of the amplifier unit output signal Vamp when the slope of the ramp waveform is set to β is equal to the amplitude value V2. The reference voltage Vref2 at this time is set to a value that is different from the reference voltage Vref1 by setting the value of the ramp waveform from time t2 to time t5 to a different value. More specifically, the reference voltage Vref2 is set to be the amplifier unit output signal Vamp obtained before the settling in the determination period from time t7 to time t8.

With such a setting, the ratio of the reference voltages (Vref1/Vref2) when the total gain is changed is not the same as the ratio of the slopes of the ramp waveform (α/β). This is because the change of the waveform until the amplifier unit output signal Vamp is settled depends not only on the level of the input signal but also on the responsiveness of the column amplifier unit 200. When the slope of the ramp waveform is small, since the signal amplitude input to the column amplifier unit 200 is also small, the responsiveness of the column amplifier unit 200 is higher, and the settling time of the amplifier unit output signal Vamp is shorter. Thus, when influence of reduced settling time of the amplifier unit output signal Vamp is taken into consideration, it is desirable that Vref2 be set to a value that is smaller than Vref1×β/α (Vref2<Vref1×β/α) when the slope β is smaller than the slope α (α>β). To summarize the above relationships, the first slope α, the second slope β, the first reference voltage Vref1, and the second reference voltage Vref2 satisfy the relational equation (α/β=V1/V2<Vref1/Vref2) in the present embodiment.

Figure 8A:
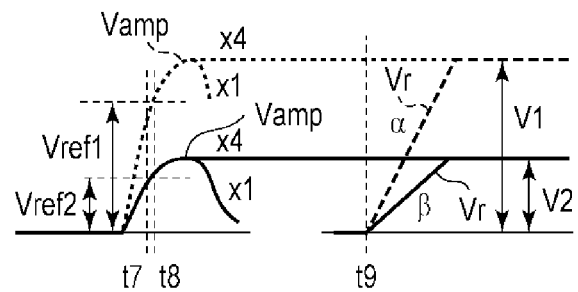
FIG. 8A, FIG. 8B, FIG. 8C, FIG. 8D, FIG. 8E, and FIG. 8F are diagrams illustrating advantages of the first embodiment.
Figure 8B:
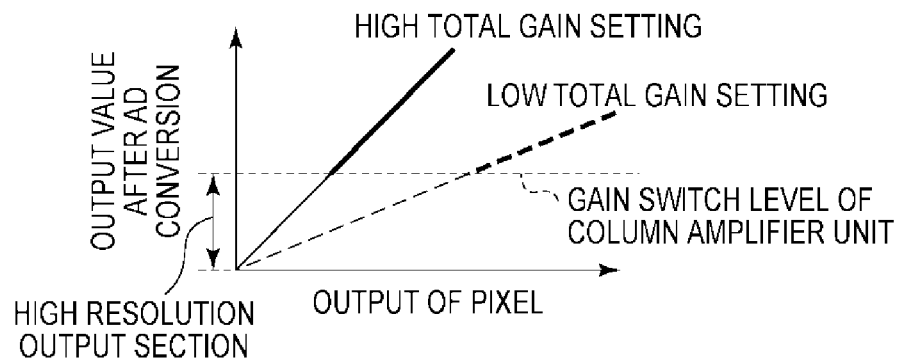

FIG. 8A to FIG. 8F are diagrams illustrating the advantages of the present embodiment. FIG. 8A and FIG. 8B are diagrams illustrating a case where the setting of a reference voltage according to the present embodiment is made. FIG. 8C to FIG. 8F are diagrams illustrating problems that may occur when the change ratio of the reference voltage is the same as the change ratio of the slope of the ramp waveform of the reference signal.

Figure 8C:
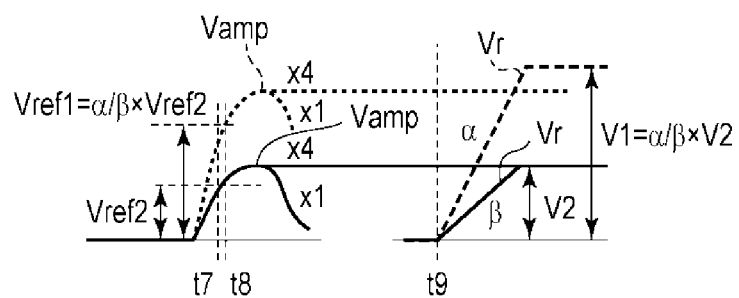
Figure 8D:
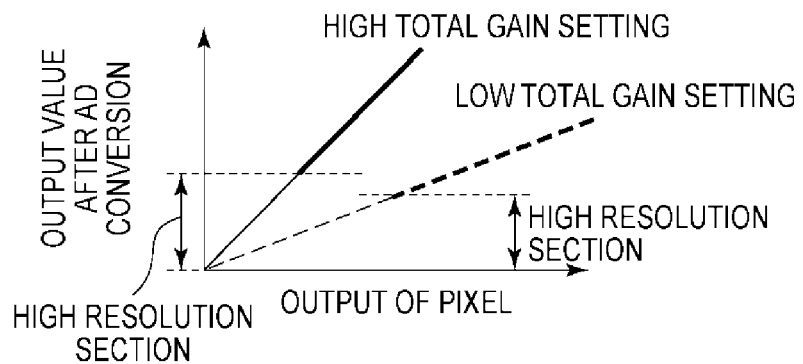
Figure 8E:
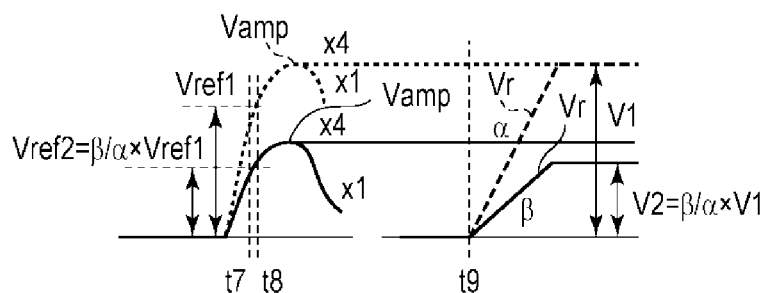

FIG. 8A, FIG. 8C, and FIG. 8E are views in which the amplifier unit output signal Vamp that is the same as illustrated in FIG. 7 and the reference signal Vr in the S_AD conversion period are illustrated on the same graph. Further, in each of FIG. 8A, FIG. 8C, and FIG. 8E, the waveform when the slope of the ramp waveform of the reference signal Vr is α (when the gain is low) is indicated by a dashed line, and the waveform when the slope is β (when the gain is high) is indicated by a solid line. In the following, the former may be referred to as a low total gain setting, and the latter may be referred to as a high total gain setting. Further, the branching of the amplifier unit output signal Vamp denoted as "×4" and "×1" in each of FIG. 8A, FIG. 8C, and FIG. 8E indicates that the gain of the column amplifier unit 200 can be switched between four-fold and one-fold.

First, with reference to FIG. 8A and FIG. 8B, an example when α/β≠Vref1/Vref2 as illustrated with reference to FIG. 7 will be described. FIG. 8A is a diagram illustrating the relationship of the amplifier unit output signal Vamp, the reference signal Vr, and the reference voltages Vref1 and Vref2 according to the reference voltage setting scheme of the present embodiment. For example, by changing the slope from α to β to change the amplitude value of the ramp waveform from V1 to V2 (=β/α×V1), it is possible to switch the low total gain setting to the high total gain setting. In addition, as described in the illustration of FIG. 7, the reference voltage of the reference signal Vr is also switched from the Vref1 to Vref2. In the present embodiment, the reference voltage Vref1 is set to be the same as the voltage of the amplifier unit output signal Vamp in the determination period that is a period before the amplifier unit output signal Vamp is settled to V1. Further, the reference voltage Vref2 is set to be the same as the voltage of the amplifier unit output signal Vamp in the determination period that is a period before the amplifier unit output signal Vamp is settled to V2. At this time, as described in the illustration of FIG. 7, the reference voltage Vref1 and the reference voltage Vref2 satisfy α/β≠Vref1/Vref2.

FIG. 8B is a diagram illustrating the relationship between the level of the output signal of the pixel 10 and the output value after AD conversion, which corresponds to the reference voltage setting of FIG. 8A. The solid line in FIG. 8B indicates a case of the high total gain setting, and the dashed line indicates a case of the low total gain setting. Each thin part of the solid line and the dashed line indicates a section in which the gain of the column amplifier unit 200 is four-fold and the digital gain is one-fold. Each thick part of the solid line and the dashed line indicates a section in which the gain of the column amplifier unit 200 is one-fold and the digital gain is four-fold. The resolution of the output signal in the section indicated by the thin line is four times that in the section indicated by the thick line.

As discussed above, in the case of FIG. 8A and FIG. 8B, the output value after AD conversion is performed at which the gain of the column amplifier unit 200 is switched is the same in both the high total gain setting and the low total gain setting. Therefore, in the present embodiment, stable input/output characteristics are obtained regardless of the gain.

Next, with reference to FIG. 8C to FIG. 8F, two comparative examples (a first comparative example and a second comparative example) in a case of α/β=Vref1/Vref2 will be described. FIG. 8C is a diagram illustrating the relationship of the amplifier unit output signal Vamp, the reference signal Vr, and the reference voltages Vref1 and Vref2 according to the reference voltage setting scheme of the first comparative example. In this comparative example, the reference voltage Vref2 is set to be the same as the voltage of the amplifier unit output signal Vamp in the determination period that is a period before the amplifier unit output signal Vamp is settled to V2. Further, the reference voltage Vref1 is set to satisfy Vref1=α/β×Vref2. At this time, the voltage after settling of the amplifier unit output signal Vamp in the case of the low total gain setting is smaller than the amplitude value V1 of the reference signal Vr. In response to the amplifier unit output signal Vamp exceeding the reference voltage Vref1 in the determination period, the gain of the column amplifier unit 200 is switched from four-fold to one-fold. Since the gain of the column amplifier unit 200 may be switched to one-fold also when the voltage after settling of the amplifier unit output signal Vamp is smaller than V1, the whole range of the amplitude value V1 of the reference signal Vr cannot be efficiently used in the low total gain setting.

FIG. 8D is a diagram illustrating the relationship between the level of the output signal of the pixel 10 and the output value after AD conversion, which corresponds to the reference voltage setting of FIG. 8C. Since denotation of the graphs is the same as that of FIG. 8B, the description thereof will be omitted. In the low total gain setting, the output value after AD conversion is performed at which the gain of the column amplifier unit 200 is switched is smaller than that in the high total gain setting. Therefore, in this comparative example, a high resolution section is narrower in the low total gain setting, and the accuracy of an output signal may decrease.

FIG. 8E is a diagram illustrating the relationship of the amplifier unit output signal Vamp, the reference signal Vr, and the reference voltages Vref1 and Vref2 according to the reference voltage setting scheme of the second comparative example. In this comparative example, the reference voltage Vref1 is set to be the same as the voltage of the amplifier unit output signal Vamp in the determination period that is a period before the amplifier unit output signal Vamp is settled to V1. Further, the reference voltage Vref2 is set to satisfy Vref2=β/α×Vref1. At this time, the voltage after settling of the amplifier unit output signal Vamp in the case of the high total gain setting is larger than the amplitude value V2 of the reference signal Vr. When the amplifier unit output signal Vamp exceeds the amplitude value V2 of the reference signal Vr, since the level of the comparison result signal Vcmp no longer changes in the whole range of the ramp waveform, the count value stored in the S-memory 403 as an S_AD conversion result becomes constant regardless of the amplifier unit output signal Vamp. Such a saturation phenomenon occurs when the amplifier unit output signal Vamp is within the range between V2 and Vref2.

Figure 8F:
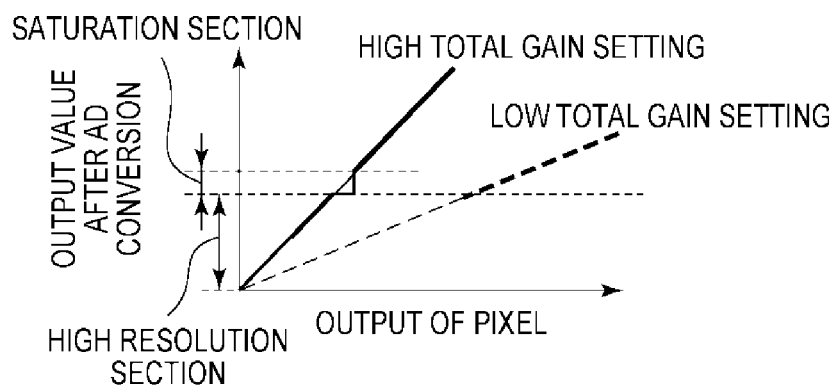

FIG. 8F is a diagram illustrating the relationship between the level of the output signal of the pixel 10 and the output value after AD conversion, which corresponds to the reference voltage setting of FIG. 8E. Since denotation of the graphs is the same as that of FIG. 8B and FIG. 8D, the description thereof will be omitted. In the high total gain setting, the output value after AD conversion is performed at which the gain of the column amplifier unit 200 is switched is larger than that in the low total gain setting. At this time, a saturation section in which the saturation phenomenon described above occurs appears in the range in which the output of the pixel 10 is larger than the high resolution section. Therefore, in this comparative example, the linearity of input/output deteriorates in the saturation section, and the accuracy of an output signal may decrease.

For the above reasons, the accuracy of an output signal may decrease in the case of α/β=Vref1/Vref2. Accordingly, in the present embodiment, the reference voltages Vref1 and Vref2 for determining the level of the amplifier unit output signal Vamp obtained before settling are set to satisfy α/β≠Vref1/Vref2. This reduces deterioration of characteristics when the slope of the ramp waveform of the reference signal Vr is changed and thereby the total gain is changed.

Therefore, according to the present embodiment, a photoelectric conversion device with improved accuracy of the output signal is provided.

In the present embodiment, the circuit configuration of the reference signal generation unit 500 is not particularly limited, and various schemes such as a capacitor charging/discharging scheme, a DAC scheme, a current steering scheme, or the like may be applied as long as a ramp waveform can be generated. Further, the shape of the ramp waveform is not limited to an up-slope type in which the potential increases in accordance with time as illustrated in the present embodiment but may be a down-slope type in which the potential decreases in accordance with time.

Second Embodiment

The first embodiment has illustrated the configuration example in which the gain of the column amplifier unit 200 is dynamically changed based on the determination result signal ATT. In contrast, in the present embodiment, a configuration example in which the slope of the ramp waveform of the reference signal Vr is dynamically changed based on the determination result signal ATT will be described. Description of features common to those in the first embodiment will be omitted.

FIG. 9 is a timing diagram illustrating the operation of the imaging device according to the present embodiment. In FIG. 9, the slope of the ramp waveform of the reference signal Vr in the N_AD conversion period is denoted as $\alpha 1$. At time t8, the determination circuit 350 outputs a determination result signal ATT having a level in accordance with the level of the comparison result signal Vcmp. Specifically, when the comparison result signal Vcmp is at the low level, the determination circuit 350 outputs a high-level determination result signal ATT, and when the comparison result signal Vcmp is at the high level, the determination circuit 350 outputs a low-level determination result signal ATT.

The determination result signal ATT is fed back to the slope of the ramp waveform of the reference signal Vr in the S_AD conversion period. When the determination result signal ATT is at the high level, the slope of the ramp waveform changes from $\alpha 1$ to $\alpha 2$. Thereby, the gain in S_AD conversion is reduced to $\alpha 1/\alpha 2$-fold. When the determination result signal ATT is at the low level, the slope of the ramp waveform remains at $\alpha 1$ without change, and the gain in the S_AD conversion is maintained. In such a way, the gain of the S_AD conversion defined by the slope of the ramp waveform is dynamically controlled in accordance with the output amplitude of the column amplifier unit 200.

An example of digital gain processing that may be applied in the present embodiment will be described. On data transferred from the S-memory 403, digital gain processing is performed at a gain of one-fold when the determination result signal ATT is at the low level, and digital gain processing is performed at a gain of $\alpha 2/\alpha 1$ when the determination result signal ATT is at the high level. Thereby, it is possible to maintain continuity between a light amount of an incident light and a final output signal. When a unit of a change in the value of an output signal in a range in which the determination result signal ATT is at the low level is 1, a unit of a change in the value of an output signal in a range in which the determination result signal ATT is at the high level is $\alpha 2/\alpha 1$. Therefore, the resolution of the processed digital signal is higher in the range of a smaller pixel output signal Vv1 and is lower in the range of a larger pixel output signal Vv1.

A method of setting a reference voltage in the present embodiment will be described with reference to FIG. 10. FIG. 10 is a timing diagram illustrating the setting of the reference voltage according to the present embodiment. Also in the present embodiment, it is assumed that the total gain of the imaging device is determined by the gain of the column amplifier unit 200, the slope of the ramp waveform of the reference signal Vr output from the reference signal generation unit 500 during the S_AD conversion period, and the digital gain in the signal processing circuit 800. One conceivable scheme for changing the total gain may be to change the slope of the ramp waveform of the reference signal Vr in the S_AD conversion period from time t9 to time t11. With respect to a change of the gain caused by a change of the ramp waveform slope of the reference signal, since the ramp signal is changed for two purposes of a change of the total gain and a change of the slope in accordance with the output amplitude of the column amplifier unit 200 in the present embodiment, description will be provided for respective purposes.

FIG. 10 illustrates four slopes $\alpha 1$, $\alpha 2$, $\beta 1$, and $\beta 2$ as the slopes of the ramp waveform in the S_AD conversion period. The change of the gain for the S_AD conversion in accordance with the output amplitude of the column amplifier unit 200 described in the illustration of FIG. 9 corresponds to switching of the slope between $\alpha 1$ and $\alpha 2$ or switching of the slope between $\beta 1$ and $\beta 2$.

On the other hand, the change of the slope of the ramp waveform for the total gain change corresponds to switching of the slope between $\alpha 1$ and $\beta 1$ or switching of the slope between $\alpha 2$ and $\beta 2$. Here, the relationship of $\beta 1/\alpha 1 = \beta 2/\alpha 2$ is established between $\alpha 1$, $\alpha 2$, $\beta 1$, and $\beta 2$.

As illustrated in FIG. 10, it is assumed that the amplitudes at the time of settling of the amplifier unit output signal Vamp when the slope of the ramp waveform is set to $\alpha 1$, $\alpha 2$, $\beta 1$, and $\beta 2$ are equal to the amplitude values V1, V1', V2, and V2', respectively. The change rate of the amplitude of the ramp waveform in accordance with a total gain change is the same as the ratio of the slope of the ramp waveform. That is, the relationship of $V1/V2 = V1'/V2' = \alpha 1/\beta 1$ is established between V1, V2, V1', V2', $\alpha 1$, and $\beta 1$ illustrated in FIG. 10. Further, the reference voltages Vref1 and Vref2 are set in the same manner as in the first embodiment. That is, the reference voltage Vref1 when the amplitude value at the time of settling is V1 is set to be the amplifier unit output signal Vamp obtained before the settling in the determination period at this time. The reference voltage Vref2 when the amplitude value at the time of settling is V2 is set to be the amplifier unit output signal Vamp obtained before the settling in the determination period at this time. Here, the appropriate setting value of the reference voltage satisfies the relational equation ($\alpha 1/\beta 1 = V1/V2 < Vref1/Vref2$) also in the present embodiment in the same manner as in the case of the first embodiment.

Figure 11A:
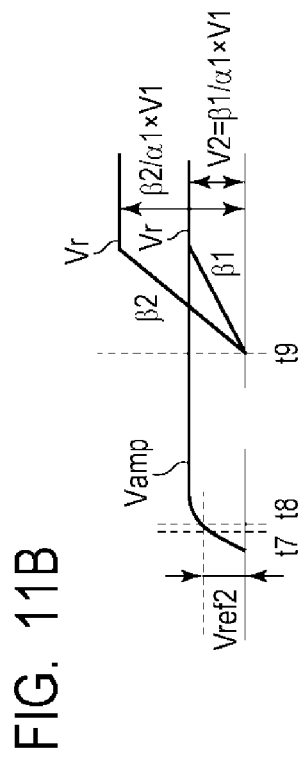
FIG. 11A, FIG. 11B, FIG. 11C, FIG. 11D, FIG. 11E, and FIG. 11F are diagrams illustrating advantages of the second embodiment.
Figure 11C:
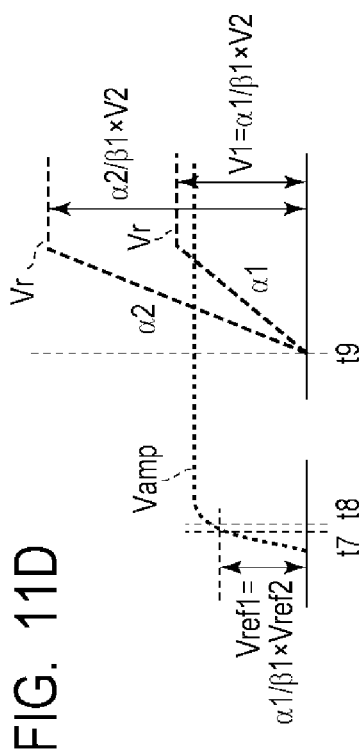
Figure 11E:
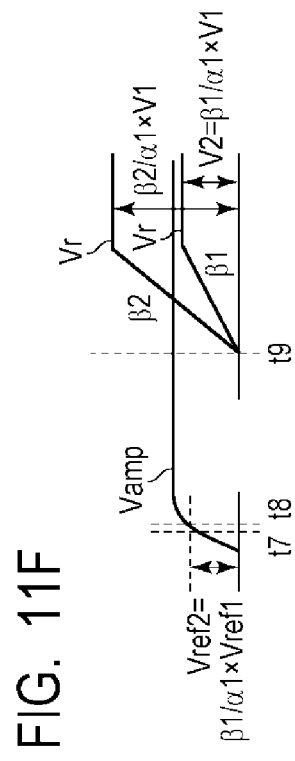
Figure 11B:
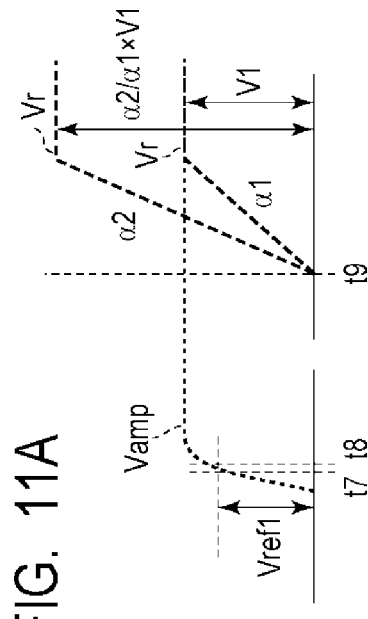

FIG. 11A to FIG. 11F are diagrams illustrating advantages of the present embodiment. FIG. 11A and FIG. 11B are diagrams illustrating a case where the setting of a reference voltage according to the present embodiment is made. FIG. 11C to FIG. 11F are diagrams illustrating problems that may occur when the change ratio of the reference voltage is the same as the change ratio of the slope of the ramp waveform of the reference signal.

FIG. 11A is a diagram illustrating the relationship of the amplifier unit output signal Vamp, the reference signal Vr, and the reference voltage Vref1 in a case of the high total gain setting. Further, FIG. 11B is a diagram illustrating the relationship of the amplifier unit output signal Vamp, the reference signal Vr, and the reference voltage Vref2 in a case of the low total gain setting. The change of the total gain corresponds to switching of the state of FIG. 11A and the state of FIG. 11B. This switching is realized by multiplying a common coefficient corresponding to the change rate of the gain by the slope of the ramp waveform of the reference signal Vr. For example, switching from the high total gain setting to the low total gain setting is realized by multiplying a coefficient $\beta 1/\alpha 1=\beta 2/\alpha 2$ by the slope of the ramp waveform of the reference signal Vr. At this time, stable output characteristics are obtained regardless of the gain for the same reason as in the first embodiment.

Figure 11D:
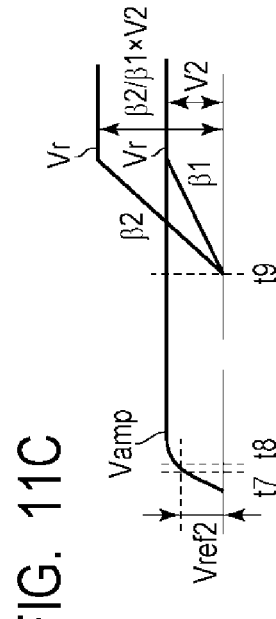

Next, with reference to FIG. 11C to FIG. 11F, two comparative examples (a third comparative example and a fourth comparative example) in a case of $\alpha 1/\beta 1=Vref1/Vref2$ will be described. FIG. 11C is a diagram illustrating the relationship of the amplifier unit output signal Vamp, the reference signal Vr, and the reference voltage Vref2 in the case of the low total gain setting of the third comparative example. FIG. 11D is a diagram illustrating the relationship of the amplifier unit output signal Vamp, the reference signal Vr, and the reference voltage Vref1 in the case of the high total gain setting of the third comparative example.

In this comparative example, the reference voltage Vref2 is set to be the same as the voltage of the amplifier unit output signal Vamp in the determination period that is a period before the amplifier unit output signal Vamp is settled to V2. Further, the reference voltage Vref1 is set to satisfy $Vref1=\alpha 1/\beta 1 \times Vref2$. At this time, the voltage after the settling of the amplifier unit output signal Vamp in the case of the low total gain setting is smaller than the amplitude value V1 of the reference signal Vr. In response to the amplifier unit output signal Vamp exceeding the reference voltage Vref1 in the determination period, the slope of the ramp waveform is switched from $\alpha 2$ to $\alpha 1$. Thus, since the slop of the ramp waveform of the column amplifier unit 200 may be switched also when the voltage after the amplifier unit output signal Vamp is settled is smaller than V1, the whole range of the amplitude value V1 of the reference signal Vr cannot be effectively used in the low total gain setting. Therefore, in this comparative example, a high resolution section is narrower in the low total gain setting, and the accuracy of an output signal may decrease as with the first comparative example.

Figure 11F:
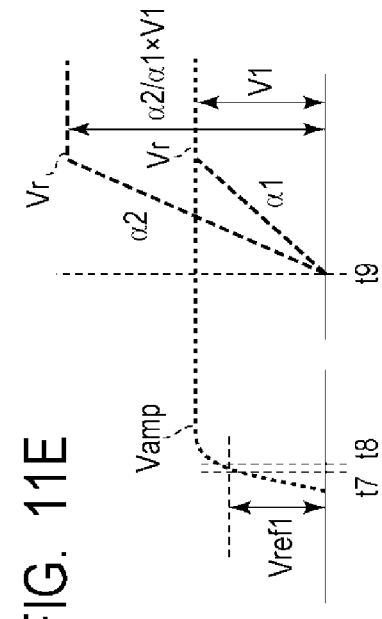

FIG. 11E is a diagram illustrating the relationship of the amplifier unit output signal Vamp, the reference signal Vr, and the reference voltage Vref1 in the case of the high total gain setting of the fourth comparative example. FIG. 11F is a diagram illustrating the relationship of the amplifier unit output signal Vamp, the reference signal Vr, and the reference voltage Vref2 in the case of the low total gain setting of the fourth comparative example.

In this comparative example, the reference voltage Vref1 is set to be the same as the voltage of the amplifier unit output signal Vamp in the determination period that is a period before the amplifier unit output signal Vamp is settled to V1. Further, the reference voltage Vref2 is set to satisfy $Vref2=\beta 1/\alpha 1 \times Vref1$. At this time, the voltage after the settling of the amplifier unit output signal Vamp in the case of the high total gain setting is larger than the amplitude value V2 of the reference signal Vr. When the amplifier unit output signal Vamp exceeds the amplitude value V2 of the reference signal Vr, since the level of the comparison result signal Vcmp no longer changes in the whole range of the ramp waveform, the count value stored in the S-memory 403 as the S_AD conversion result becomes constant regardless of the amplifier unit output signal Vamp. This saturation phenomenon occurs when the amplifier unit output signal Vamp is within the range between V2 and Vref2. Therefore, in this comparative example, the linearity of input/output deteriorates in the saturation section, and the accuracy of an output signal may decrease as with the second comparative example.

For the above reasons, the reference voltages Vref1 and Vref2 for determining the level of the amplifier unit output signal Vamp obtained before settling are set to satisfy $\alpha 1/\beta 1 \neq Vref1/Vref2$ also in the present embodiment as with the first embodiment. This reduces deterioration of characteristics when the slope of the ramp waveform of the reference signal Vr is changed and thereby the total gain is changed. Therefore, according to the present embodiment, a photoelectric conversion device with improved accuracy of the output signal is provided.

Third Embodiment

In the first embodiment and the second embodiment, the setting of the reference voltages Vref1 and Vref2 is performed by stopping, at time t5, increase of the potential of the ramp waveform starting from time t2, as illustrated in FIG. 7 and FIG. 10. Further, in the first embodiment and the second embodiment, the reference voltages Vref1 and Vref2 are set to different values from each other by changing the slope of the ramp waveform. However, the setting of the reference voltages Vref1 and Vref2 may be performed by a scheme other than the above. In the present embodiment, another example of a setting method of the reference voltages Vref1 and Vref2 will be described.

Figure 12A:
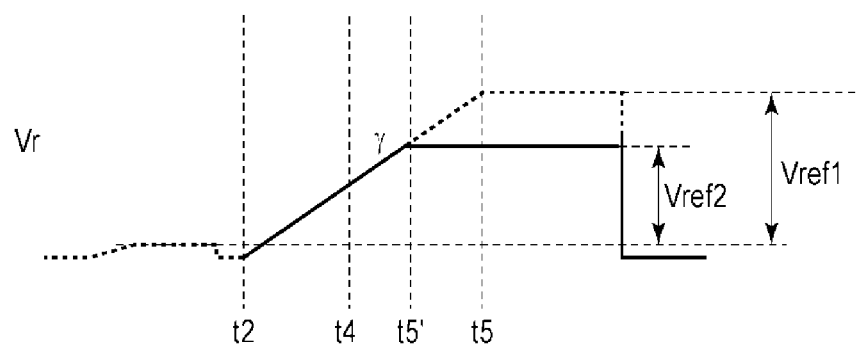
FIG. 12A and FIG. 12B are diagrams illustrating an example of a ramp waveform according to a third embodiment.

FIG. 12A is a diagram illustrating a first setting method of the reference voltages Vref1 and Vref2. In this example, the slope $\gamma$ of the ramp waveform of the reference signal Vr is the same for the reference voltages Vref1 and Vref2. In this example, however, the reference voltage Vref1 is set by stopping increase of the potential at time t5, and the reference voltage Vref2 is set by stopping increase of the potential at time t5'. In such a way, the reference voltages Vref1 and Vref2 may be set by controlling the period of change of the potential of the ramp waveform.

Figure 12B:
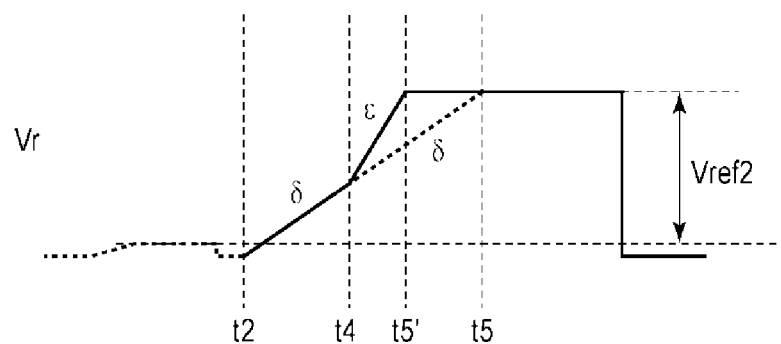

FIG. 12B is a diagram illustrating a second setting method of the reference voltage Vref2. In this example, the slope of the ramp waveform during the N_AD conversion period from time t2 to time t4 is $\delta$, and the slope of the ramp waveform during the period from time t4 to time t5' is $\epsilon$. In such a way, in this example, the reference voltage Vref2 is set by changing the slope of the ramp waveform within the period from time t2 to time t5. Note that the reference voltage Vref1 may also be set by the same scheme.

Note that, although the setting of the reference voltage is set by using the potential at the time when the potential of the ramp waveform stops increasing in the example described above, the embodiment is not limited thereto. For example, the reference voltages Vref1 and Vref2 may be set based on the value stored in a register of a control device that controls driving of the imaging device. That is, the reference voltages Vref1 and Vref2 may be generated by control from a source other than a circuit that is a source of the ramp waveform.

Fourth Embodiment

Figure 13:
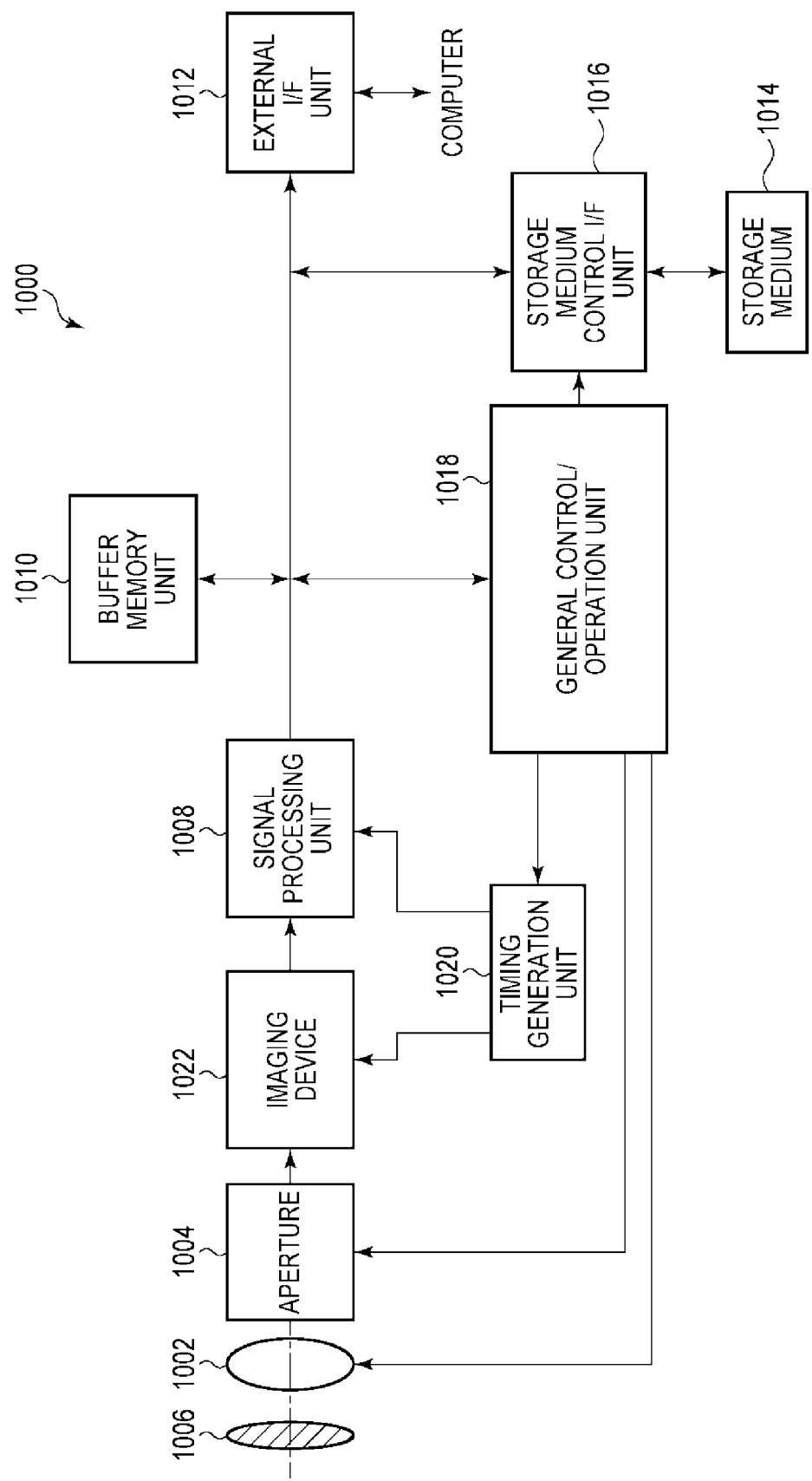
FIG. 13 is a block diagram illustrating a configuration example of an imaging system according to a fourth embodiment.

Next, an example of a device to which the imaging device according to the embodiments described above is applied will be described. FIG. 13 is a block diagram illustrating the configuration of an imaging system 1000 according to the present embodiment. An imaging device 1022 illustrated in FIG. 13 is any of the imaging devices described in the above first to third embodiments. The imaging system 1000 to which the imaging device 1022 is applicable may be, for example, a digital camera, a digital camcorder, a surveillance camera, or the like. FIG. 13 illustrates a configuration example of a digital camera to which the imaging device 1022 described in each of the above embodiments is applied.

An imaging system 1000 illustrated in FIG. 13 as an example has the imaging device 1022, a lens 1002 that captures an optical image of a subject onto the imaging device 1022, an aperture 1004 for changing a light amount passing through the lens 1002, and a barrier 1006 for protecting the lens 1002. The lens 1002 and the aperture 1004 form an optical system that converges a light onto the imaging device 1022.

The imaging system 1000 further has a signal processing unit 1008 that performs processing on an output signal output from the imaging device 1022. The signal processing unit 1008 performs a signal processing operation to perform various correction and compression on an input signal if necessary and output the processed signal.

The imaging system 1000 further has a buffer memory unit 1010 used for temporarily storing image data therein and an external interface unit (external IF unit) 1012 for communicating with an external computer or the like. The imaging system 1000 further has a storage medium 1014 such as a semiconductor memory used for performing storage or readout of imaging data and a storage medium control interface unit (storage medium control I/F unit) 1016 used for performing storage or readout on the storage medium 1014. Note that the storage medium 1014 may be embedded in the imaging system 1000 or may be removable.

The imaging system 1000 further has a general control/operation unit 1018 that performs various calculation and controls the entire digital camera and a timing generation unit 1020 that outputs various timing signals to the imaging device 1022 and the signal processing unit 1008. Here, the timing signal or the like may be input from the outside, and the imaging system 1000 may have at least the imaging device 1022 and the signal processing unit 1008 that processes an output signal output from the imaging device 1022. The general control/operation unit 1018 and the timing generation unit 1020 may be configured to perform a part or the whole of the function regarding control of the photoelectric conversion device, such as generation of the control signals, generation of the reference voltages, or the like in the embodiments described above.

The imaging device 1022 outputs an imaging signal to the signal processing unit 1008. The signal processing unit 1008 performs predetermined signal processing on an imaging signal output from the imaging device 1022 and outputs image data. Further, the signal processing unit 1008 uses the imaging signal to generate an image.

As described above, the imaging system 1000 of the present embodiment includes the imaging device 1022 according to each of the first to third embodiments. Accordingly, the imaging system 1000 that can perform capturing at higher quality can be realized.

Fifth Embodiment

Figure 14A:
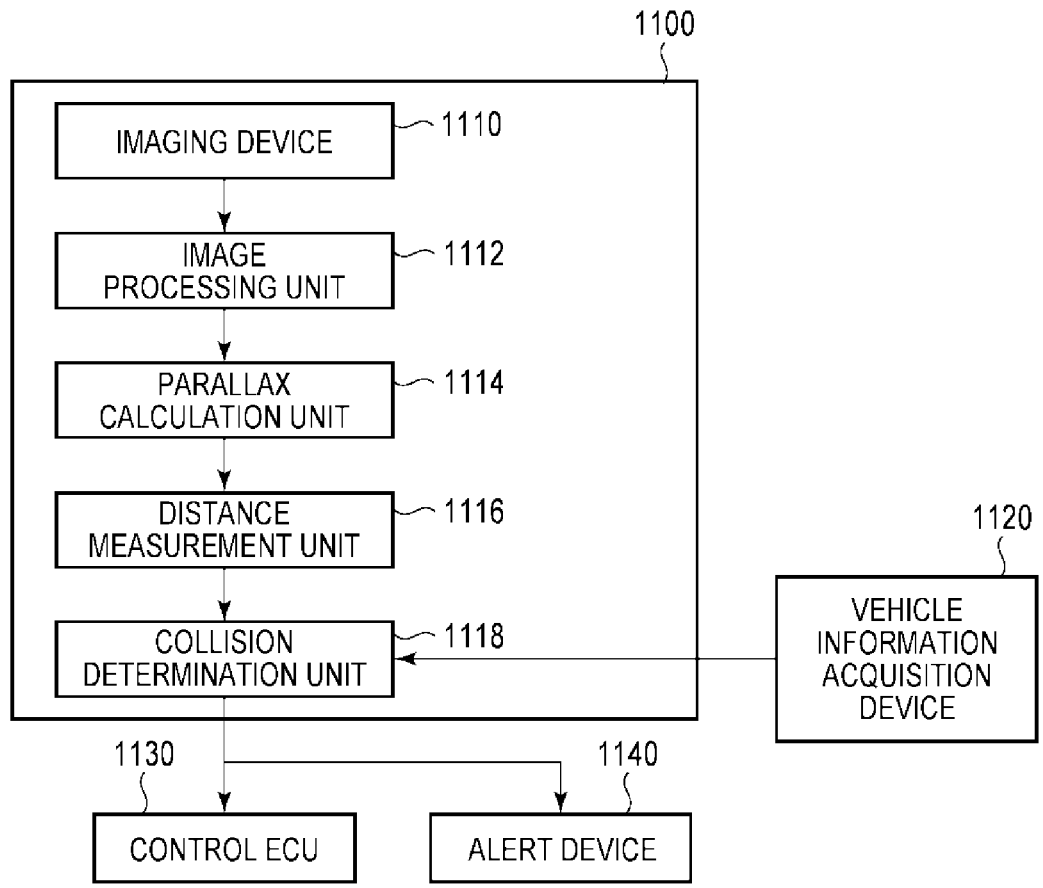
FIG. 14A and FIG. 14B are diagrams illustrating a configuration example of an imaging system and a mobile apparatus according to a fifth embodiment.
Figure 14B:
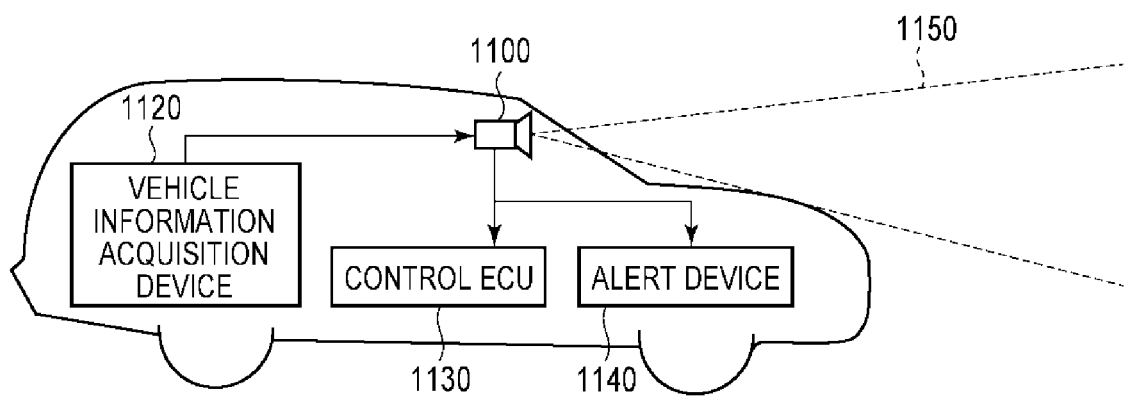

FIG. 14A and FIG. 14B are diagrams illustrating the configuration of an imaging system 1100 and a mobile apparatus according to the present embodiment. FIG. 14A is a diagram illustrating an example of the imaging system 1100 regarding an on-vehicle camera. The imaging system 1100 has an imaging device 1110 described in any of the above first to third embodiments. The imaging system 1100 has an image processing unit 1112 that performs image processing on a plurality of image data acquired by the imaging device 1110 and a parallax calculation unit 1114 that calculates a parallax (a phase difference of parallax images) from the plurality of image data acquired by the imaging system 1100. Further, the imaging system 1100 has a distance measurement unit 1116 that calculates a distance to the object based on the calculated parallax and a collision determination unit 1118 that determines whether or not there is a collision possibility based on the calculated distance. Here, the parallax calculation unit 1114 and the distance measurement unit 1116 are an example of a distance information acquisition unit that acquires distance information on the distance to the object. That is, the distance information is information on a parallax, a defocus amount, a distance to an object, or the like. The collision determination unit 1118 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The imaging system 1100 is connected to the vehicle information acquisition device 1120 and can acquire vehicle information such as a vehicle speed, a yaw rate, a steering angle, or the like. Further, the imaging system 1100 is connected to a control ECU 1130, which is a control device that outputs a control signal for causing a vehicle to generate braking force based on a determination result by the collision determination unit 1118. That is, the control ECU 1130 is an example of a mobile apparatus control unit that controls a mobile apparatus based on distance information. Further, the imaging system 1100 is also connected to an alert device 1140 that issues an alert to the driver based on a determination result by the collision determination unit 1118. For example, when the collision probability is high as the determination result of the collision determination unit 1118, the control ECU 1130 performs vehicle control to avoid a collision or reduce damage by applying a brake, pushing back an accelerator, suppressing engine power, or the like. The alert device 1140 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 1100. FIG. 14B illustrates the imaging system 1100 when a front area of a vehicle (a capturing area 1150) is captured. The vehicle information acquisition device 1120 transmits an instruction to operate and cause the imaging system 1100 to perform capturing. The imaging system 1100 of the present embodiment including the imaging device 1110 according to first to third embodiments can further improve ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a mobile apparatus (moving apparatus) such as a ship, an airplane, or an industrial robot, for example. In addition, the imaging system can be widely applied to a device which utilizes object recognition, such as an intelligent transportation system (ITS), without being limited to mobile apparatuses.

Other Embodiments

Embodiments of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, it should be appreciated that an embodiment in which a part of the configuration of any of the embodiments is added to another embodiment or an embodiment in which a part of the configuration of any of the embodiments is replaced with a part of the configuration of another embodiment is also one of the embodiments to which the present invention may be applied.

This application claims the benefit of Japanese Patent Application No. 2019-032896, filed Feb. 26, 2019 which is hereby incorporated by reference herein in its entirety.

What is claimed is:

1. A photoelectric conversion device comprising:
a pixel configured to generate a first signal in accordance with an incident light by photoelectric conversion;
an amplifier unit configured to amplify the first signal to output a second signal; and
a comparator unit configured to compare a voltage of the second signal with a voltage of a reference signal,
wherein in a first period that is a period before the voltage of the second signal is settled, the voltage of the reference signal is a reference voltage,
wherein in the first period, the comparator unit compares the voltage of the second signal with the reference voltage to generate a determination result signal used for setting a gain,
wherein in a second period that is a period after the voltage of the second signal is settled, the reference signal has a ramp waveform whose voltage changes in accordance with time,
wherein in the second period, the comparator unit compares the voltage of the second signal with a voltage of the ramp waveform to perform analog-to-digital conversion,
wherein a slope of the ramp waveform is configured to be switched between a first slope $\alpha$ and a second slope $\beta$,
wherein the reference voltage is configured to be switched between a first reference voltage Vref1 corresponding to the first slope $\alpha$ and a second reference voltage Vref2 corresponding to the second slope $\beta$, and
wherein the first slope $\alpha$, the second slope $\beta$, the first reference voltage Vref1, and the second reference voltage Vref2 satisfy $\alpha/\beta \neq \text{Vref1/Vref2}$.

2. The photoelectric conversion device according to claim 1, wherein the first slope $\alpha$, the second slope $\beta$, the first reference voltage Vref1, and the second reference voltage Vref2 satisfy $\alpha > \beta$ and $\alpha/\beta < \text{Vref1/Vref2}$.

3. The photoelectric conversion device according to claim 1, wherein in accordance with the determination result signal, the amplifier unit changes a gain used when amplifying the first signal and outputting the second signal.

4. The photoelectric conversion device according to claim 1, wherein the comparator unit changes the slope of the ramp waveform in accordance with the determination result signal.

5. The photoelectric conversion device according to claim 1, wherein the determination result signal is used for setting a digital gain for a digital signal generated by analog-to-digital conversion in the comparator unit.

6. The photoelectric conversion device according to claim 1,
wherein when the voltage of the second signal is the first reference voltage Vref1 in the first period, the voltage of the second signal in the second period matches a range of the voltage of the ramp waveform of the first slope $\alpha$, and
wherein when the voltage of the second signal is the second reference voltage Vref2 in the first period, the voltage of the second signal in the second period matches a range of the voltage of the ramp waveform of the second slope $\beta$.

7. The photoelectric conversion device according to claim 1, wherein the first reference voltage Vref1 and the second reference voltage Vref2 are generated by controlling a period of change of the voltage of the ramp waveform.

8. The photoelectric conversion device according to claim 1, wherein the first reference voltage Vref1 and the second reference voltage Vref2 are generated by controlling the slope of the ramp waveform.

9. The photoelectric conversion device according to claim 1, wherein the first reference voltage Vref1 and the second reference voltage Vref2 are generated from a source that is different from a source of the ramp waveform.

10. An imaging system comprising:
the photoelectric conversion device according to claim 1; and
a signal processing unit configured to process a signal output form the photoelectric conversion device.

11. A mobile apparatus comprising:
the photoelectric conversion device according to claim 1;
a distance information acquisition unit configured to acquire distance information on a distance to an object, from a parallax image based on signals from the photoelectric conversion device; and a control unit configured to control the mobile apparatus based on the distance information.

* * * * *